(12) United States Patent
Kao et al.

(10) Patent No.: US 10,868,166 B2
(45) Date of Patent: Dec. 15, 2020

(54) HIGHLY STRAINED SOURCE/DRAIN TRENCHES IN SEMICONDUCTOR DEVICES

(75) Inventors: Ta-Wei Kao, Sijhih (TW); Shiang-Bau Wang, Taoyuan (TW); Ming-Jie Huang, Hsinchu (TW); Chi-Hsi Wu, Hsinchu (TW); Shu-Yuan Ku, Zhubei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 38 days.

(21) Appl. No.: 13/251,961

(22) Filed: Oct. 3, 2011

(65) Prior Publication Data
US 2012/0018786 A1    Jan. 26, 2012

Related U.S. Application Data

(62) Division of application No. 12/428,905, filed on Apr. 23, 2009, now Pat. No. 8,071,481.

(51) Int. Cl.
*H01L 29/76* (2006.01)
*H01L 29/78* (2006.01)
*H01L 29/66* (2006.01)

(52) U.S. Cl.
CPC ........ *H01L 29/78* (2013.01); *H01L 29/66636* (2013.01)

(58) Field of Classification Search
CPC ........... H01L 29/66636; H01L 29/7848; H01L 29/6656; H01L 29/665; H01L 29/78651
USPC ........... 257/190, 285, 288, E21.06, E21.211, 257/E21.238, E21.42, E21.431, E21.549, 257/E21.553, E21.555, E21.585, E29.085, 257/E29.255; 438/222, 226, 299, 498, 438/589, 689, 700, 706, 711–714, 438/FOR. 120, FOR. 172, FOR. 238, 438/FOR. 250
See application file for complete search history.

(56) References Cited

U.S. PATENT DOCUMENTS

| | | |
|---|---|---|
| 6,090,718 A | 7/2000 | Soga et al. |
| 6,318,384 B1 | 11/2001 | Khan et al. |
| 6,383,938 B2 | 5/2002 | Pandhumsoporn et al. |

(Continued)

OTHER PUBLICATIONS

M. Horstmann, et al., Integration and Optimization of Embedded-Si—Ge, Compressive and Tensile Stressed Liner Films, and Stress Memorization in Advanced SOI CMOS Technologies. IEEE, ISBN: 0-7803-9269-8, Aug. 2005, USA.

*Primary Examiner* — Meiya Li
(74) *Attorney, Agent, or Firm* — Duane Morris LLP

(57) ABSTRACT

A semiconductor device is formed by a multi-step etching process that produces trench openings in a silicon substrate immediately adjacent transistor gate structures formed over the substrate surface. The multi-step etching process is a Br-based etching operation with one step including nitrogen and a further step deficient of nitrogen. The etching process does not attack the transistor structure and forms the openings. The openings are bounded by upper surfaces that extend downwardly from the substrate surface and are substantially vertical, and lower surfaces that bulge outwardly from the upper vertical sections and undercut the transistor structure. The openings may be filled with a suitable source/drain material to produce SSD transistors with desirable $I_{dsat}$ characteristics.

17 Claims, 5 Drawing Sheets

(56) References Cited

U.S. PATENT DOCUMENTS

| | | |
|---|---|---|
| 2002/0132486 A1 | 9/2002 | Williams et al. |
| 2002/0151183 A1 | 10/2002 | Yang et al. |
| 2002/0185469 A1 | 12/2002 | Podlesnik et al. |
| 2002/0192969 A1 | 12/2002 | Losee |
| 2005/0266631 A1 | 12/2005 | Kim et al. |
| 2006/0115949 A1* | 6/2006 | Zhang et al. ............... 438/300 |
| 2007/0004123 A1* | 1/2007 | Bohr ................ H01L 21/30608 438/230 |
| 2007/0018205 A1* | 1/2007 | Chidambarrao et al. ..... 257/288 |
| 2007/0020861 A1* | 1/2007 | Chong ................ H01L 29/7833 438/296 |
| 2007/0105331 A1 | 5/2007 | Murthy et al. |
| 2007/0187362 A1 | 8/2007 | Nakagawa et al. |
| 2007/0252204 A1* | 11/2007 | Wei et al. ..................... 257/347 |
| 2008/0081449 A1 | 4/2008 | Cho et al. |
| 2008/0102624 A1 | 5/2008 | Cho et al. |
| 2008/0261355 A1* | 10/2008 | Goktepeli ......... H01L 21/31155 438/154 |
| 2008/0286978 A1 | 11/2008 | Chen et al. |
| 2008/0290370 A1* | 11/2008 | Han ................ H01L 21/823807 257/192 |
| 2009/0095982 A1 | 4/2009 | Kim |
| 2010/0001323 A1 | 1/2010 | Tateshita |
| 2010/0093178 A1 | 4/2010 | Honda |
| 2010/0187578 A1* | 7/2010 | Faltermeier ....... H01L 29/66636 257/288 |

\* cited by examiner

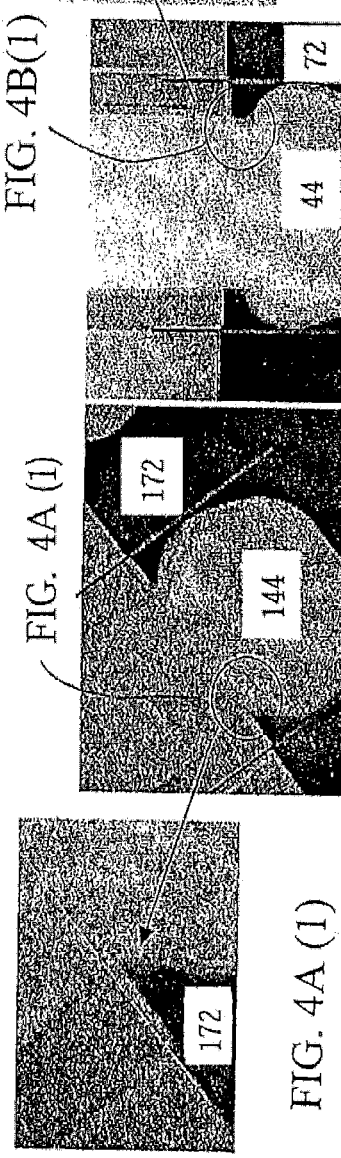

HIGHLY STRAINED SOURCE/DRAIN TRENCHES IN SEMICONDUCTOR DEVICES

RELATED APPLICATION

This application is a divisional application of U.S. patent application Ser. No. 12/428,905, filed on Apr. 23, 2009, the contents of which are hereby incorporated by reference as if set forth in their entirety.

TECHNICAL FIELD

The present invention relates, most generally, to semiconductor devices and methods for forming the same. More particularly, the present invention relates to methods for forming trenches for highly strained source/drain regions in semiconductor transistor devices and the transistor devices so formed.

BACKGROUND

In today's rapidly advancing semiconductor manufacturing industry, there is a continuing push to produce smaller, faster and more efficient semiconductor devices. One such device that this principle applies to is the transistor device. Transistor devices may be manufactured by forming transistor gate structures including a transistor gate and sidewall spacers, over a substrate surface then forming openings in the substrate then filling the openings to produce source/drain regions. The substrate is typically formed of bulk, single crystal silicon that may include various lattice orientations. After these substrate openings are formed, selected epitaxial growth, SEG, or other deposition techniques may be used to fill the openings with SiGe or other suitable materials that will serve as the source/drain regions for the transistors or other semiconductor devices formed over the surface. The source/drain regions may then be silicided.

According to various conventional methods, the openings formed in the substrate are formed using the structures formed over the semiconductor substrate, e.g. the transistor gate structures, as self-aligned mask structures. The openings have a profile determined by the etching process used to produce the openings which may undercut the transistor gate or other self-aligned mask structures. The etching process significantly impacts the degree of undercut and the stress level of the etched silicon, and the stress level has a profound influence upon $I_{dsat}$ performance. When forming the substrate openings that will be used for source/drain regions in transistor devices, it is advantageous to use aggressive isotropic etch processes to produce an increased tensile stress, as this improves hole mobility in the formed devices. It is known that extended isotropic etch times desirably extend the lateral encroachment, i.e. undercut of the opening and produce increased tensile stress levels in the etched silicon surfaces created. By increasing the isotropic etch step time, however, the degree of undercut of the surface immediately beneath the edge of the self-aligned masking structure formed over the surface, is undesirably increased. As a result, attack and erosion of the overlying structures undesirably occurs and pull-back of the edge of the opening undesirably occurs. When the masking structure is a transistor gate with SiN sidewall spacers, the aggressive isotropic etch may attack the spacers, recede the edges of the spacers and pull-back the substrate surface immediately beneath the edges of the spacers. This undesirably results in significant SCE (short channel effects).

It would therefore be desirable to provide an etch process that increases the tensile stress in the produced trench without attacking the structures formed over the substrate surface and without aggressively undercutting the substrate silicon that resides directly and immediately beneath the self-aligned masking structure, such that pull-back of the edges of the opening occurs.

SUMMARY

To address these and other needs and in view of its purposes, one aspect of the invention provides a method for forming a semiconductor structure.

The method comprises providing a silicon substrate with a device structure disposed over a substrate surface thereof and removing material from over the substrate surface to result in the silicon substrate having an exposed substrate surface portion and a further substrate surface portion covered by the device structure. The method further provides for etching the silicon substrate by performing a plurality of Br-based etch processes that selectively etch silicon and not SiN. The plurality of Br-based etch processes include a first Br-based etch step including nitrogen as an etching gas and a second Br-based etch step that does not include nitrogen as an etching gas. The method further provides further etching the silicon substrate using an etch chemistry that includes F and Cl.

According to another aspect, provided is a semiconductor device comprising a silicon wafer with at least a duality of openings extending downwardly from a wafer surface thereof and defining a silicon mesa therebetween. The silicon mesa comprises a top surface that is a portion of the wafer surface and substantially vertical side surfaces that extend downwardly from the top surface then curve inwardly to produce concave side surfaces that extend underneath the top surface. A transistor structure is formed above the top surface and includes a transistor gate and a duality of opposed sidewall spacers disposed adjacent each of the opposed sidewalls of the transistor gate. Each sidewall spacer includes an outer surface having a lower substantially vertical surface section thereof, each lower substantially vertical surface section extending to a corresponding edge of the top surface and being substantially co-linear with the corresponding substantially vertical side surface of the opening.

According to yet another aspect, the invention provides a semiconductor device comprising a transistor structure formed over a surface of a silicon substrate. The transistor structure includes a transistor gate and a duality of SiN sidewall spacers adjacent opposed sides of the transistor gate. An opening is formed in the silicon substrate adjacent the transistor structure. The opening extends downwardly from the surface and beneath the transistor structure. The opening is bounded by sidewalls, each including a substantially vertical upper wall section that extends generally linearly downward from the surface for at least seven nanometers then curves outwardly beneath the transistor structure.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIGS. 1A-1D are cross-sectional views that illustrate a sequence of processing operations used to form exemplary semiconductor device structures in accordance with the present invention;

FIGS. 4A, 4A(1), 4B and 4B(1) are cross-sectional views that illustrate, by comparison, the advantageous undercut profile produced by the method of the present invention whereby FIGS. 4A and 4A(1) show an exemplary structure of the PRIOR ART and FIGS. 4B and 4B(1) show a comparable structure in accordance with the present invention.

DETAILED DESCRIPTION

Figure 1A:
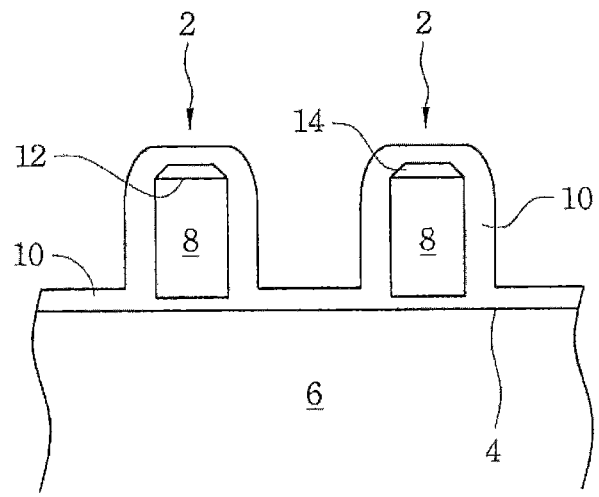

FIG. 1A is a cross-sectional view showing an exemplary semiconductor structure including two transistor structures 2 formed over surface 4 of substrate 6. Substrate 6 is a semiconductor substrate and may be a bulk silicon substrate that may be single crystal or other silicon and it may include various lattice orientations. Substrate 6 may also be referred as a wafer, such term conventionally used in the semiconductor manufacturing industry. Transistor structures 2 each include transistor gate 8. Transistor gate 8 may be formed of polycrystalline silicon, i.e., "polysilicon" or other suitable transistor gate materials. Silicon nitride, SiN layer 10 is disposed over surface 4 and transistor structures 2. In particular, SiN layer 10 is formed over hard mask 14 disposed over top surface 12 of transistor gate 8 of transistor structures 2. Hard mask 14 may be any of various conventionally used hard mask materials such as an oxide. Various conventional methods are known and may be used to form the structure shown in FIG. 1A.

Figure 1B:
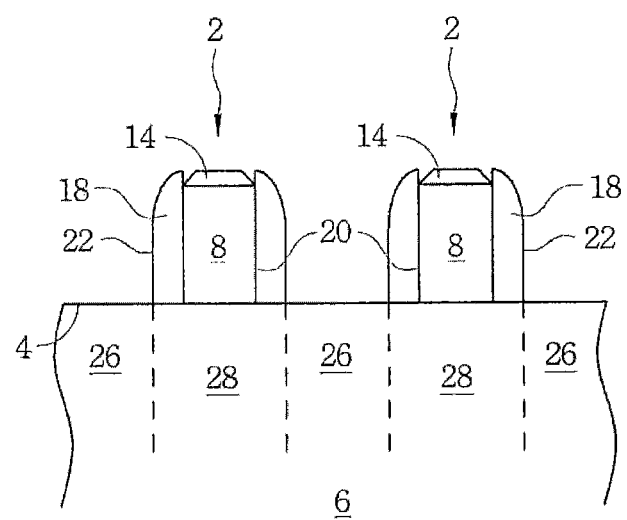

At least one processing operation is then performed on the structure of FIG. 1A to produce the structure shown in FIG. 1B. Various conventional methods may be used to produce the structure shown in FIG. 1B. A conventional anisotropic etch process may be used to remove portions of SiN film 10 to produce sidewall spacers 18 shown in FIG. 1B. Sidewall spacers 18 are formed of SiN and are disposed adjacent sidewalls 20 of transistor gates 8. The conventional anisotropic etching procedure used to form sidewalls 18, removes SiN film 10 from portions of substrate surface 4 to result in exposed portions of substrate 6 and covered portions of substrate 6. FIG. 1B illustrates these so-defined sections in substrate 6 as separated by dashed lines. Exposed portions 26 are not covered by structures over substrate surface 4 and covered portions 28 are covered by transistor structures 2. Openings will be formed in exposed portions 26 according to subsequent processing operations as will be shown.

The conventional etching procedure used to produce the structure shown in FIG. 1B from the structure shown in FIG. 1A may include a silicon nitride main etch step followed by a silicon nitride overetch step. Various etching parameters and etching procedures may be used for each of the silicon nitride main etch and overetch operations. According to one exemplary embodiment, the silicon nitride main etch step may use the following gas constituents: 75 sccm $CF_4$, 75 sccm HBr and 13 sccm $HeO_2$, various suitable pressures, powers and biases, and an etch time that may vary according to the thickness of the film being removed. Such gas flow parameters are intended to be exemplary only. According to various exemplary embodiments, the silicon nitride main etch may include gas flows in the following ranges: 50-100 sccm $CF_4$, 50-100 sccm HBr and 5-20 sccm $HeO_2$. The silicon nitride overetch, according to one exemplary embodiment, may include gas flows of about 100 sccm $CH_3F$, about 60 sccm $O_2$ and about 120 sccm He but other values may be used in other exemplary embodiments. The silicon nitride overetch may include various suitable pressures, power, and bias voltages and may include gas flows within the ranges of about 50-150 sccm $CH_3F$, about 40-90 sccm $O_2$ and about 80-160 sccm He. Such is intended to be exemplary only. Other conventional methods for forming sidewall spacers 18 from SiN film 10 may be used in other exemplary embodiments.

Sidewall spacers 18 disposed adjacent respective sidewalls 20 of transistor gate 8 include outer surfaces 22. Transistor structures 2 are then used as self-aligned masks to etch openings into exposed portions 26 of substrate 6.

Figure 1C:
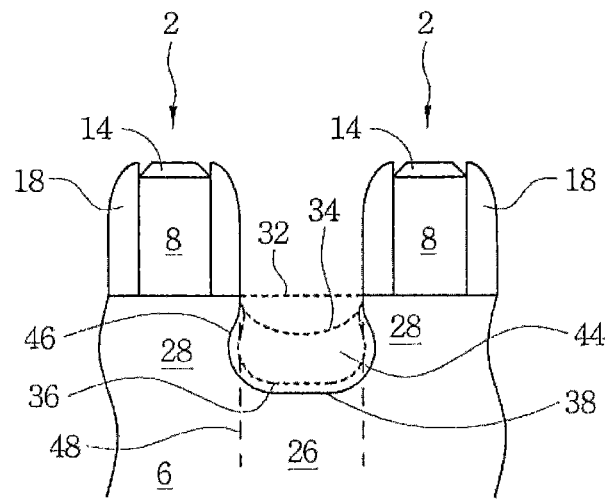

FIG. 1C shows a plurality of exemplary profiles sequentially formed in accordance with the methods of the invention, to progressively produce an opening in substrate 6 between transistor structures 2. The successive profiles of the opening formed to extend downwardly into substrate 6, are shown by dashed lines 34 and 36 and solid line 38 which represent stages in the progressive formation of the opening. Dashed line 32 indicates the position of surface 4 (shown in FIGS. 1A and 1B) prior to the silicon etching processes that produce the opening. Prior to the etching steps that etch silicon substrate 6, a conventional breakthrough etching operation may optionally be carried out upon the structure shown in FIG. 1B. The breakthrough etching operation removes native oxide that may have formed on exposed silicon surfaces such as surface 4 of substrate 6.

The silicon etching process includes a first Br-based etching step including nitrogen gas as an etching gas and is terminated when an opening defined by dashed line 34 is produced. Dashed line 34 is intended to be exemplary only and to illustrate that the first Br-based etching step is not used to produce the final opening. The first Br-based etching step etches silicon with a high selectivity to silicon nitride and therefore does not attack sidewall spacers 18. The second portion of the Br-based etching process that selectively removes silicon but not silicon nitride such as sidewall spacers 18 formed of silicon nitride, is a Br-based etch step that does not include nitrogen as an etching gas and produces an opening having a profile represented by dashed line 36. An overetch process may then be used to complete the etch to produce an opening defined by solid line 38.

According to one exemplary embodiment, the two Br-based, etch steps may be identical except for the presence of nitrogen gas in the first etching step and the absence of nitrogen gas from the second etching step. The opening having a profile defined by dashed line 34 does not exhibit undercut of the transistor structures 2 and includes inwardly tapered sidewalls. The opening having a profile defined by dashed line 36 and produced by the second Br-based etch step deficient of nitrogen is seen to be more rounded and the profile indicated by solid line 38 of the exemplary opening formed in silicon substrate 6 after the overetch step is carried out, is more rounded still and exhibits undercut. This structure will be shown in more detail in FIG. 1D.

Still referring to FIG. 1C, according to one exemplary embodiment, the first Br-based etch step may include etch gasses of HBr, $HeO_2$, and $N_2$ whereas the second Br-based etch step may include HBr and $HeO_2$. The overetch step that produces the final shape of the opening may include $Cl_2$ and $NF_3$ as etchant gasses according to one exemplary embodiment but other overetch processes may be used in other exemplary embodiments. According to one exemplary embodiment, the first Br-based etch step preferentially etches silicon with a high selectivity to silicon nitride, i.e., as the opening is being formed to extend downwardly from surface 4, sidewall spacers 18 remain essentially intact. The first Br-based etch step may include various suitable pressures, powers, etch biases and other relevant system parameters. Relative flow rates of $HBr:HeO_2:N_2$ may be about 200:17:40 according to one exemplary embodiment. As such, according to one exemplary embodiment, the flow rate of HBr may be about 200 sccm, the flow rate of $HeO_2$ may be about 17 sccm and the flow rate of $N_2$ may be about 40 sccm. According to other exemplary embodiments, the flow rate of HBr may range from about 100 sccm to 300 sccm, the flow rate of $HeO_2$ may range from about 10 to about 40 sccm and the flow rate of $N_2$ may range from about 20 to about 60 sccm. Each of these values is intended to be exemplary only and other values and parameters may be used in other exemplary embodiments.

According to one exemplary embodiment, the second Br-based etch step may include the same system parameters used for the first Br-based etch step and the gas flow parameters provided above for the first Br-based etch step, except for. $N_2$ which is absent.

After the second Br-based etch step which is an isotropic etching step, is carried out, an isotropic overetch portion is then carried out. According to one exemplary embodiment, the isotropic overetch process may include various suitable pressure values and may include a pressure greater than the pressures used in the Br-etching steps. The isotropic overetch process may use suitable powers and bias voltages and gas flows of about 30 to 90 sccm of $Cl_2$, preferably about 60 sccm and about 5-15 sccm of $NF_3$, preferably about 9 sccm.

Figure 1D:
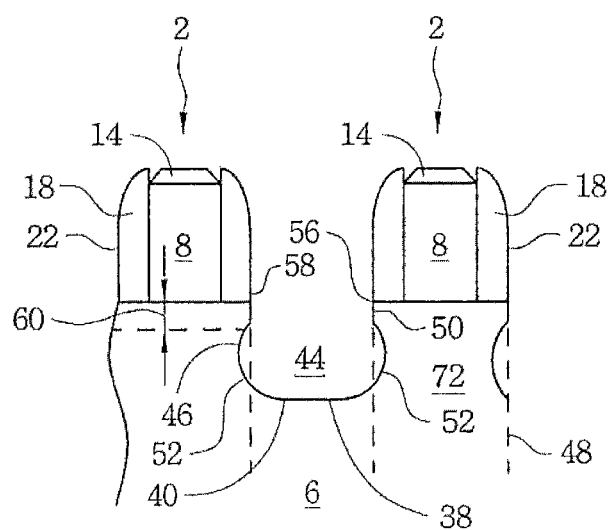

The two-step Br-based etch process, together with the overetch produces an opening 44 shown in FIG. 10 as bounded by solid line 38, and more clearly in FIG. 1D. FIG. 1D shows the exemplary structure shown in FIG. 10 without dashed lines 32, 34, 36 that illustrates the progression of the openings sequentially formed by the corresponding etching operations. Referring to FIGS. 1C-1D, opening 44 is defined and bounded by solid line 38 and extends under and thereby undercuts each of the transistor structures 2 as the overetch step is an aggressive isotropic etch process that allows opening 44 to undercut each of the transistor structures 2 and thus advantageously provides a high tensile stress and improved $I_{dsat}$ for the transistor structures to be formed from this structure. The undercut is the degree to which sidewalls 46 of opening 44 extend laterally inwards past the outer boundary represented by dashed line 48 of transistor structure 2 and therefore underneath the adjacent sidewall spacer 18 of transistor structure 2. Opening 44 includes horizontally flat bottom surface 40 in the embodiments illustrated in FIGS. 10, 1D but bottom surface 40 may be rounded in other exemplary embodiments. Because of the novel two-step Br-based main etch process, however, sidewall spacers 18 are maintained essentially intact and the substrate portion immediately subjacent the lateral edges of sidewall spacers 18 advantageously remains intact as will be shown in more detail in FIG. 2. Pull back of the upper edges of opening 44 is prevented. Approaching intersection 56, it can be seen that lower sections 58 of outer surfaces 22 of sidewall spacers 18, are essentially linear and at intersection 56 they are essentially vertical and co-linear with substantially vertical upper surface portion 50 of sidewalls 46 of opening 44 as shown in FIG. 10. The degree of undercut will vary and it should be understood that opening 44 shown in FIG. 1D is exemplary only. Opening 44 may be considered a trench opening, according to conventional terminology.

Figure 2:
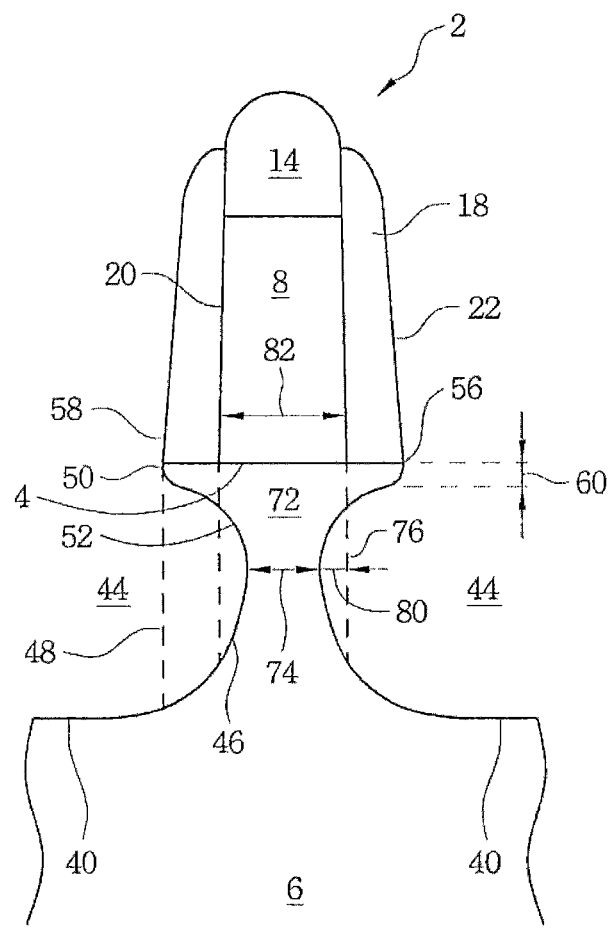
FIG. 2 is a cross-sectional view showing an exemplary semiconductor device structure formed in accordance with the present invention.

FIG. 2 shows another exemplary etched structure formed according to the processing sequence described in conjunction with FIGS. 1A-1D. Mesa 72 is formed of silicon and disposed between opposed openings 44. Openings 44 are defined by bottom surfaces 40 and sidewalls 46. The sidewalls 46 that define opening 44 include upper surface portion 50 and lower surface portion 52. Upper surface portions 50 are substantially vertical and lower surface portions 52 are substantially convex with respect to opening 44 and concave with respect to mesa 72 formed between openings 44 and under transistor structures 2. Lower surface portions 52 of sidewalls 46 of opening 44 illustrate the extent of undercut of transistor structures 2. Approaching intersection 56, it can be seen that lower sections 58 of outer surfaces 22 of sidewall spacers 18, are essentially co-linear with upper surface portion 50 of sidewalls 46 of opening 44. Upper surface portions 50 extend downwardly to depth 60 before turning inwardly. Depth 60 may range from about 5-15 nanometers, nm, in various exemplary embodiments indicating that the silicon of substrate 6 that is immediately beneath sidewall spacers 18 is substantially intact up to depth 60 and therefore not undercut. Sidewall spacers 18 are similarly maintained intact.

The degree and shape of undercut illustrated by exemplary lower surface portion 52 is intended to be exemplary only and produces a stress in the etched surfaces. The undercut produces mesa 72 having a minimum width 74 that is less than width 82 of corresponding transistor gate 8. The curved surfaces of lower surface portions 52 of sidewalls 46 of openings 44 extend laterally inward past dashed line 48 indicating the lateral edge of transistor structure 2 and also inwardly past dashed line 76 representing sidewalls 20 of transistor gate 8. Lower surface portions 52 extend laterally inward by distance 80 with respect to the outer edges of transistor gate 8 indicated by sidewalls 20, i.e. opening 44 undercuts transistor gate 8 by distance 80 on each side. According to one exemplary embodiment, distance 80 may vary from about 5-15 nanometers, but other degrees of undercut may be produced according to other exemplary embodiments. Minimum width 74 of mesa 72 may therefore be about 10-30 nanometers less than width 82 of transistor gate 8. Such is intended to be exemplary only.

After opening 44, embodiments of which are shown in FIGS. 1D and 2, is formed, the fabrication process may continue by next using selected epitaxial growth or other deposition techniques to fill opening 44 with a suitable material that will be used as the source/drain regions for transistor devices that may be formed using subsequent, known processing operations such as SEG, selective epitaxial growth. Various suitable and known methods may be used for the epitaxial growth or other deposition processes. In one exemplary embodiment, SiGe may be formed in openings 44 but other suitable materials such as silicides or materials that may be later silicided, may be used in other exemplary embodiments.

Figure 3:
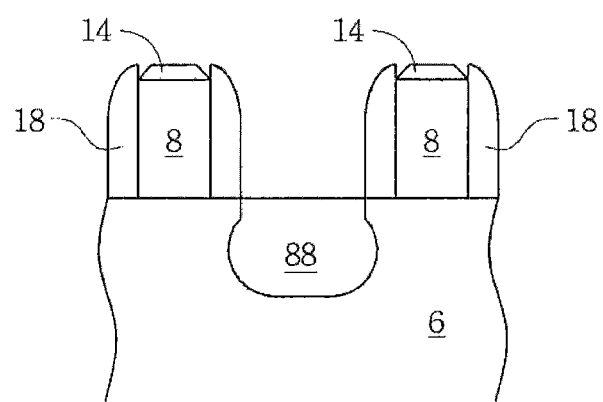
FIG. 3 is a cross-sectional view showing an exemplary semiconductor device including source/drain regions formed in accordance with the present invention.

FIG. 3 shows the structure shown in FIG. 1D, after source/drain material 88 has been formed in previous opening 44 shown in FIG. 1D. Conventional methods may be used to form a silicide of the source/drain material 88. It can be seen that source/drain material 88 is a common source/drain material to both transistor structures 2 as the source/ drain material 88 extends beneath the adjacent sidewall spacer 18 of each of the two transistor structures 2.

FIGS. 4A and 4B are TEM micrographs showing an advantage of the present invention. FIG. 4A shows opening 144 formed according to the PRIOR ART. FIG. 4B shows another exemplary opening 44 formed according to an aspect of the invention. Mesa 172 is adjacent opening 144 in FIG. 4A and mesa 72 is adjacent opening 44 shown in FIG. 4B. It can be seen, in the comparison between expanded subsections FIGS. 4A(1) and 4B(1), that the uppermost edge of mesa 72 is intact immediately beneath sidewall spacer 18 and upper surface portion 50 is substantially vertical, linear and co-linear with lower section 58 of outer surface 22 of sidewall spacer 18 according to the inventive structure shown in FIGS. 4B and 4B(1). In the prior art illustrated by FIGS. 4A and 4A(1), it can be seen that the upper corner of mesa 172 is immediately undercut, degrading the channel that will be formed under the corresponding transistor, and undesirably causing significant short channel effects.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor device, comprising:
   a silicon substrate with a plurality of openings extending downwardly from a substrate surface of said silicon substrate and defining a silicon mesas between respective two openings of said plurality of openings, each silicon mesas comprising a top surface that is a portion of said substrate surface, at least one upper surface portion bordering the top surface and having a substantially vertical side surface, and at least one concave lower surface portion that borders the at least one upper surface portion and curves under the top surface;
   a plurality of transistor structures, each transistor structure of said plurality of transistor structures formed above said top surface of a corresponding one of said silicon mesas, each transistor structure of said plurality of transistor structures including a transistor gate and respective sidewall spacers contacting opposed sidewalls of said transistor gate and contacting a hard mask on top of said transistor gate; and
   a source/drain structure disposed between a first transistor gate and a second transistor gates of said plurality of transistor structures, the first transistor gate and the second transistor gates being immediately adjacent to one another, wherein the source/drain structure comprises:
      a first vertical sidewall portion aligned with a vertical sidewall of a first sidewall spacer formed on a sidewall of the first transistor gate;
      a second vertical sidewall portion aligned with a vertical sidewall of a second sidewall spacer formed on a sidewall of the second transistor gate;
      a first curved sidewall portion extending from the first vertical sidewall portion and curving inwardly toward the first transistor gate so as to undercut the first sidewall spacer;
      a second curved sidewall portion extending from the second vertical sidewall portion and curving inwardly toward the second transistor gate so as to undercut the second sidewall spacer;
      a flat top surface that is coplanar with the top surface of the silicon substrate; and
      a flat bottom surface disposed between and connecting a bottom portions of each of the first curved sidewall portion and the second curved sidewall portion.

2. The semiconductor device as in claim 1, wherein said substantially vertical side first vertical sidewall portion and said second vertical sidewall portions each extends downwardly from said top surface for at least about 7 nanometers.

3. The semiconductor device as in claim 1, wherein each transistor gates include a first width and each silicon mesas include a minimum width being at least 20 nanometers less than said first width.

4. The semiconductor device as in claim 1, wherein said single continuous source/drain material is formed of silicon germanium.

5. The semiconductor device as in claim 1, wherein each transistor gate is formed of polycrystalline silicon.

6. The semiconductor device as in claim 1, wherein said sidewall spacers are each formed of silicon nitride.

7. The semiconductor device as in claim 1, wherein said source/drain structure is formed of a material that is configured to be silicided.

8. The semiconductor device as in claim 1, wherein said source/drain structure is formed of a silicide.

9. The semiconductor device as in claim 1, wherein each of said first vertical sidewall portion and said second vertical sidewall portion extends downwardly from said top surface for 5 nanometers to 15 nanometers.

10. A semiconductor device, comprising:
    a semiconductor substrate with a plurality of openings extending downwardly from a top surface of the semiconductor substrate, each of said plurality of openings bounded and defined by substantially vertical side semiconductor surfaces extending downwardly from said top surface and concave side semiconductor surfaces which meet located below respective ones of said substantially vertical side semiconductor surfaces;

a pair of transistor structures formed above said top surface, each of said pair of transistor structures including a transistor gate and a pair of opposed sidewall spacers contacting respective ones of opposed sidewalls of said transistor gate and contacting a hard mask on top of said transistor gate; and a source/drain structure disposed between a first transistor gate and a second transistor gates of said pair of transistor structures, the first transistor gate and the second transistor gates being immediately adjacent to one another, wherein the source/drain structure comprises:

a first vertical sidewall portion aligned with a vertical sidewall of a first sidewall spacer formed on a sidewall of the first transistor gate;

a second vertical sidewall portion aligned with a vertical sidewall of a second sidewall spacer formed on a sidewall of the second transistor gate;

a first curved sidewall portion extending from the first vertical sidewall portion and curving inwardly toward the first transistor gate so as to undercut the first sidewall spacer;

a second curved sidewall portion extending from the second vertical sidewall portion and curving inwardly toward the second transistor gate so as to undercut the second sidewall spacer;

a flat top surface that is coplanar with the top surface of the silicon substrate; and a flat bottom surface disposed between and connecting a bottom portions of each of the first curved sidewall portion and the second curved sidewall portions.

11. The semiconductor device as in claim 10, wherein said semiconductor substrate is a silicon substrate.

12. The semiconductor device as in claim 10, wherein said substrate opening extends underneath said pair of transistor structures and laterally inward by at least 11 nanometers.

13. The semiconductor device as in claim 10, wherein source/drain structure is formed of a material comprising silicon germanium.

14. The semiconductor device as in claim 13, wherein said source/drain structure is formed of a material comprising silicide.

15. The semiconductor device as in claim 10, wherein said each sidewall spacer is formed of a material comprising silicon nitride.

16. The semiconductor device as in claim 10, wherein each of said first vertical sidewall portion and said second vertical sidewall portion extends downwardly from said top surface for 5 nanometers to 15 nanometers.

17. The semiconductor device as in claim 10, wherein each of said first vertical sidewall portion and said second vertical sidewall portion extends downwardly from said top surface for at least 7 nanometers.

* * * * *